United States Patent
Mays, II et al.

(10) Patent No.: US 10,356,873 B1
(45) Date of Patent: Jul. 16, 2019

(54) MULTIPLE INTERFACE LED DRIVER WITH INHERENT OVERVOLTAGE PROTECTION

(71) Applicant: Universal Lighting Technologies, Inc., Madison, AL (US)

(72) Inventors: Stephen D. Mays, II, Madison, AL (US); John J. Dernovsek, Madison, AL (US); Matthew Gann, Madison, AL (US); Scott Price, Madison, AL (US); Dane Sutherland, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 16/113,345

(22) Filed: Aug. 27, 2018

Related U.S. Application Data

(60) Provisional application No. 62/553,203, filed on Sep. 1, 2017.

(51) Int. Cl.
  *H05B 37/02* (2006.01)
  *H05B 33/08* (2006.01)
  *G01R 21/133* (2006.01)

(52) U.S. Cl.
  CPC ..... *H05B 33/0887* (2013.01); *H05B 33/0815* (2013.01); *H05B 33/0848* (2013.01); *H05B 37/0272* (2013.01); *G01R 21/133* (2013.01)

(58) Field of Classification Search
  CPC ............ H05B 33/0887; H05B 37/0272; H05B 33/0848; H05B 33/0815; G01R 21/133
  (Continued)

(56) References Cited

U.S. PATENT DOCUMENTS 6,144,539 A    11/2000   Konopka et al.
6,204,613 B1    3/2001   Hesterman
(Continued)

FOREIGN PATENT DOCUMENTS

EP        2306791 A2    6/2011
WO    2014013377 A2    1/2014

OTHER PUBLICATIONS

I2CBUS: NT3H1101/NT3H1201: I2C—Energy harvesting NFC Forum Type 2 Tag with field detection pin and I2C interface, Rev 3.3—Jul. 15, 2015, 265433, Product data sheet, Company Public.

*Primary Examiner* — Daniel D Chang
(74) *Attorney, Agent, or Firm* — Patterson Intellectual Property Law, PC; Gary L. Montle

(57) ABSTRACT

A lighting device is provided with input terminals that receive corresponding terminals from any one of an analog or digital dimming device or a driver configuration device. Depending on the type of connected device, different circuits are enabled by a controller to receive dimming control signals from an analog or digital dimming device, or to receive device configuration data from a multiple driver configuration device. A wireless interface circuit receives and stores configuration data via an antenna. The controller automatically detects whether one of the analog or digital dimming device or the driver configuration device is coupled to the input terminals, enables a corresponding one of the analog and digital interface circuit or the driver configuration interface circuit, and generates output current reference signals for regulating the output current from the driving circuit, said reference signals corresponding to the received dimming control signals via the analog and digital interface circuit.

20 Claims, 9 Drawing Sheets

(58) Field of Classification Search
USPC .......................................................... 315/224
See application file for complete search history.

(56) References Cited

U.S. PATENT DOCUMENTS

| | | | |
|---|---|---|---|
| 6,356,027 B1 | 3/2002 | Zhang et al. | |
| 7,333,353 B2 | 2/2008 | Yin | |
| 7,750,577 B2 | 7/2010 | Nerone et al. | |
| 8,654,485 B1 | 2/2014 | Koehler | |
| 9,565,744 B2 | 2/2017 | Lai et al. | |
| 9,681,512 B1 | 6/2017 | Xiong et al. | |
| 2010/0102747 A1 | 4/2010 | Ilyes et al. | |
| 2010/0181935 A1 | 7/2010 | Wu | |
| 2012/0262432 A1 | 10/2012 | Kamata et al. | |
| 2015/0054423 A1 | 2/2015 | Tyson et al. | |
| 2015/0163878 A1* | 6/2015 | Dixon | H05B 33/0845 315/201 |
| 2016/0330808 A1* | 11/2016 | Brandt | H05B 33/0845 |
| 2017/0215250 A1* | 7/2017 | Kimura | H05B 37/0209 |

* cited by examiner

US 10,356,873 B1

MULTIPLE INTERFACE LED DRIVER WITH INHERENT OVERVOLTAGE PROTECTION

CROSS-REFERENCES TO RELATED APPLICATIONS

This application claims benefit of U.S. Provisional Patent Application No. 62/553,203, filed Sep. 1, 2017, and which is hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND

The present invention relates generally to lighting apparatus, systems, and methods for simultaneously configuring multiple drivers, such as light emitting diode (LED) drivers.

For many luminaire manufacturers it may be desirable to configure the operating parameters of LED drivers before shipping to customers for installation, without requiring coupling of the LED drivers to a mains power source. It is further desirable to configure various operating parameters of the LED driver at other stages of application, again without having to apply mains input power to the LED driver. For example, when a driver is first removed from its packaging, it may be desired to apply a default configuration to satisfy the needs for most of the LED drivers at a particular installation. Further, once a new driver is installed with other LED drivers in a luminaire, it may be required that all the drivers in the luminaire or series of luminaires receive a configuration unique to their installation.

It is also desired to be able to be able to dim an LED driver (or a series of LED drivers) via either an analog signal or a digital data stream. It may also be required that a luminaire or series of luminaires be able to report data regarding its particular operation, such as input or output power.

Generally speaking, conventional dimming control interface circuits are designed for connection to an external device, while a power stage for an associated driver or electronic ballast is designed for connection to a mains AC power source. A conventional interface circuit may be designed to deliver a small current, with a DC control voltage obtained from a variable resistor, shunt regulator, light-level controller, etc. Shunt regulators for example may control electronic ballasts by setting the voltage across the control input terminals to a predetermined voltage range, wherein upon disconnection of the shunt regulator from the control interface the open-circuit voltage across the control terminals rises to approximately the upper end of the range.

In designing for these connections, a lighting device and associated interface circuitry usually include a pair of control signal input terminals for connection to the DC control voltage and a pair of mains AC power input terminals for connection to the external mains power source. However, an all-too common problem during the installation of these lighting devices is where control signal input terminals are inadvertently coupled to a mains line input source. Such an error may result in a great deal of damage to the interface circuitry. Further, where a single interface circuit may be provided for a plurality of drivers, such damage may extend to an array of drivers and multiply the costs of replacement accordingly. Protection circuits are known in the art for protecting the control interface circuitry in electronic ballasts against line voltages. In response to the application of line voltages, high impedance is provided to limit current in the protection circuit and clamping circuitry may be further provided to limit the output voltage from the protection circuit to the interface circuitry and the remainder of the electronic ballast generally. However, such circuits typically also utilize PTC thermistors or high voltage transistors to provide such protection, which increases the cost of the circuit. It would further be desirable to provide a relatively low cost interface circuit with sufficient protection against the application of line voltages.

BRIEF SUMMARY

Certain embodiments of a lighting device as disclosed herein feature a comprehensive list of configuration and dimming options.

In a particular example, these goals are accomplished by integrating into one LED driver a wireless configuration device employing Near Field Communication (NFC) technology, a multiple driver configuration (MDC) circuit, and an analog and digital dimming interface circuit. To configure the driver outside the luminaire, either a memory device such as a dual-port electrically erasable programmable read-only memory (EEPROM) integrated circuit (IC) with an NFC interface can be accessed wirelessly via, e.g., an antenna and a configuration device equipped with a Radio Frequency Identification (RFID) transceiver IC, the input terminals (e.g., violet and gray wires) of the MDC circuit can be accessed via a wired connection, or the input terminals (e.g., violet and gray wires) of the digital dimming interface can be accessed via a wired connection. Once installed in the luminaire, the input terminals can be accessed by a configuration device, at which point the controller in the LED driver will be powered up and configured.

After the luminaire equipped with the LED drivers is installed, the output current of the driver can be modified via either the analog or digital dimming interface. The analog and digital dimming interface will automatically determine whether a digital or analog dimming device is connected.

In one embodiment, a lighting device as disclosed herein comprises a driving circuit configured to convert AC mains input power into an output current for driving a lighting load. First and second input terminals are configured to receive corresponding terminals from any one of an analog dimming device, a digital dimming device or a driver configuration device. An analog and digital interface circuit is coupled to the first and second terminals and configured to receive dimming control signals from an analog dimming device or a digital dimming device when coupled thereto. A driver configuration circuit is coupled to the first and second terminals and configured to receive device configuration data from a driver configuration device when coupled thereto. A controller is further configured to automatically detect whether one of the analog dimming device, the digital dimming device or the driver configuration device is coupled to the first and second terminals, to enable a corresponding one of the analog and digital interface circuit or the driver configuration interface circuit, and to generate output current reference signals for regulating the output current from the driving circuit, said reference signals corresponding to the received dimming control signals via the analog and digital interface circuit.

In another embodiment, the lighting device further includes a wireless interface circuit coupled to an antenna and linked thereby to a wireless communications network for transmitting and receiving configuration data, wherein the wireless interface circuit is configured to store configuration data received during operation of the lighting device as new configuration data separate from stored current configuration data.

In another embodiment, the controller is further configured upon a restart condition to retrieve the new configuration data from the wireless interface circuit and execute any associated configuration commands, and subsequently to obtain and execute any additional configuration commands determined from device configuration data received from a driver configuration device via the driver configuration interface circuit.

In another embodiment, the antenna is positioned external to a lighting device housing otherwise containing the wireless interface circuit, the controller and the interface circuits in an interior thereof.

In another embodiment, the analog and digital interface circuit is further configured to power one of an analog dimming device or a digital dimming device coupled thereto.

In another embodiment, the analog and digital interface circuit is further configured to measure power consumption data regarding the one of the analog dimming device or the digital dimming device coupled thereto.

In another embodiment, the wireless interface circuit is further configured to store data corresponding to the measured power consumption data, and the stored power consumption data is retrievable remotely via the wireless communications network.

In another embodiment, the digital interface circuit is further configured to receive device configuration data from a driver configuration device coupled thereto.

In another embodiment, the lighting device further includes a first regulator circuit coupled to a DC bus voltage derived from the AC mains input power and configured to produce an intermediate DC voltage, and a second regulator circuit coupled to receive the intermediate DC voltage and to the driver configuration circuit. The second regulator circuit is configured to produce a supply voltage to the controller via the driver configuration circuit when a driver configuration device is coupled to the first and second terminals, and to otherwise produce the supply voltage to the controller via the first regulator circuit.

In another embodiment, the driver configuration circuit comprises at least first and second communications nodes linked to the controller, and controller protection circuitry coupled to each of the at least first and second communications output nodes.

In another embodiment, the analog and dimming interface circuit is coupled to receive the intermediate DC voltage from the first regulator, and includes at least one switching element. A current output to an analog dimming device or a digital dimming device is provided via the first and second terminals and regulated by switching the at least one switching element on and off according to drive signals from the controller.

In another embodiment, controller protection circuitry is further coupled between the at least one switching element and the drive signal inputs from the controller.

In another embodiment, the analog and dimming interface circuit comprises at least first and second digital communications nodes linked to the controller, and controller protection circuitry coupled to each of the at least first and second communications output nodes.

In another embodiment, the driving circuit further comprises one or more switching elements configured to produce the output current for driving the lighting load based on a switching frequency, and a driving circuit controller configured to generate gate drive signals to regulate the switching frequency of the switching elements based on the current reference signals.

DETAILED DESCRIPTION

Figure 1:
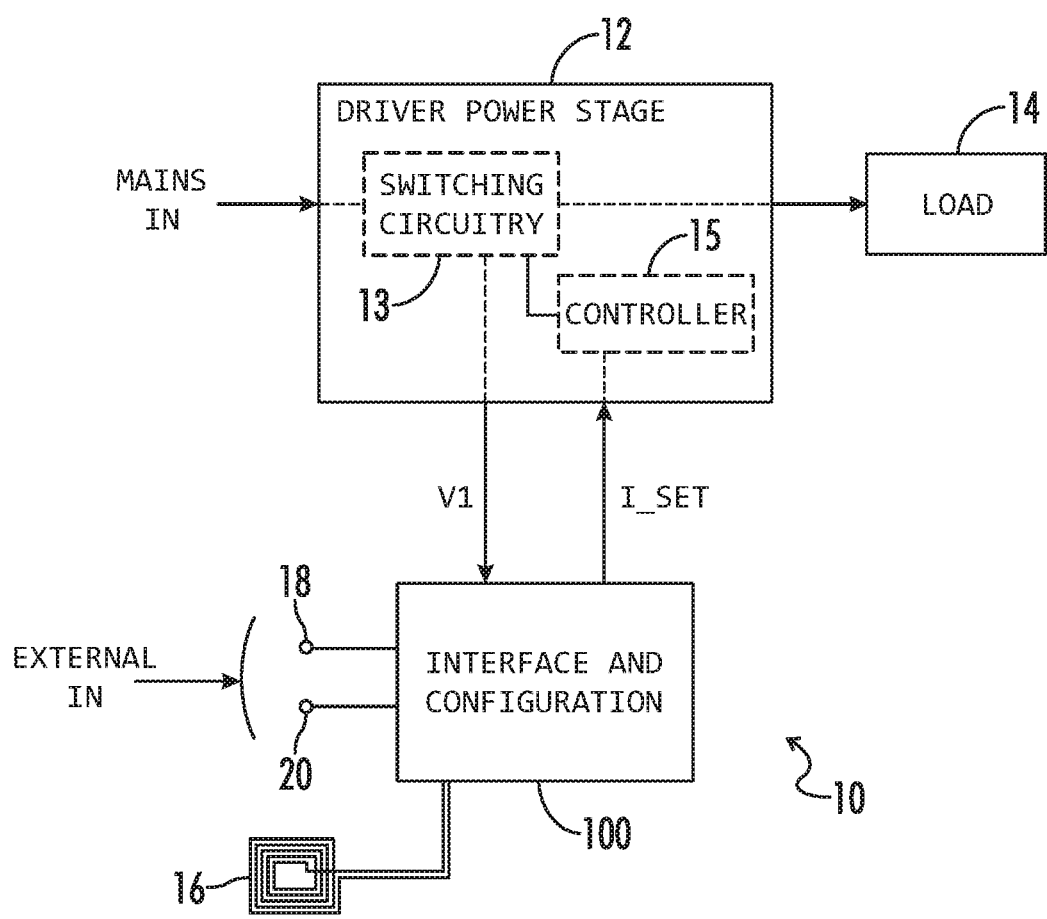
FIG. 1 is a block diagram representing an embodiment of a lighting device as disclosed herein.

Referring generally to FIGS. 1-9, various exemplary embodiments of an invention may now be described in detail. Where the various figures may describe embodiments sharing various common elements and features with other embodiments, similar elements and features are given the same reference numerals and redundant description thereof may be omitted below.

Referring first to an embodiment of a lighting device 10 as shown in FIG. 1, a power stage 12 includes input terminals to receive input power from an external power supply, such as for example an AC mains input, and is configured to convert the AC input power to provide an appropriate output power for driving a light source, or load 14. In particular embodiments as described below, the lighting device 10 is an LED driver for generating output current to a light source comprising one or more LED's. The power stage 12 may typically include an AC-DC section (not shown), configured for example as a diode bridge rectifier to convert the AC mains input into an intermediate DC bus voltage V1.

The power stage 12 may further include a DC-DC section (not shown) with switching circuitry 13, alone or as provided with additional rectifying circuitry, for further converting of the DC bus voltage V1 into a DC output to the load. In an embodiment for example the DC-DC section may include a DC-AC stage wherein the switching circuitry produces an AC current through a primary winding of an isolation transformer, and an AC-DC stage including a secondary winding of the transformer and a diode bridge to rectify an AC current there through into an output DC current to the load. A current sensor such as a current sensing resistor may be coupled in series with the load, wherein a voltage develops on a current sensing terminal that has a magnitude with respect to a secondary circuit ground reference that is proportional to the current flowing through the load, and may be provided as control feedback (see below).

A power stage controller 15 may be provided to regulate a switching frequency of the DC-DC section based on a desired output current.

An interface and configuration circuit 100 includes first and second interface terminals 18, 20 to receive an external dimming control device or a wired configuration device. An antenna 16 or coil is further provided, for example mounted outside of a lighting device housing and coupled with circuitry therein, to facilitate wireless interconnection with a wireless external device. The interface and configuration circuit 100 receives the DC bus voltage V1 as derived in the power stage 12 from the AC mains input. The interface and configuration circuit 100 also generates a reference current signal I_set corresponding to a desired output current set point based on a dimming control signal from the external dimming control device.

The term device configuration data may be used herein to refer to parameters that are received and stored for programming operation of the lighting device (e.g., LED driver). Exemplary configuration data may include parameters (or values associated with said parameters) such as minimum and maximum output currents, dimming curve (e.g., linear, logarithmic), dimming control voltages, on/off states for enabling or disabling various programmable features such as lumen maintenance, a threshold voltage for triggering on/off functions, etc.

Dimming control signals as described herein may refer to digital inputs corresponding to a lighting output such as a 0-100% dimming value, or an equivalent as allowable for the particular lighting device or load. Otherwise stated, the dimming control signals may specify a desired lighting output, whereas the device configuration data may specify internal operating parameters enabling the device controller to appropriately provide the desired lighting output.

In an embodiment, a reference current signal I_set from the interface and configuration circuit 100 is provided to the power stage controller, which further regulates the switching frequency in the power stage to provide the desired output current, either directly through gate drive signals to the respective switching elements, or indirectly via a dedicated gate driver circuit. In an alternative embodiment, the power stage controller may be configured to provide functionality as further described below with respect to a controller for the interface and configuration circuit, wherein the reference current is determined internally and no corresponding signal is generated or required.

Figure 2:
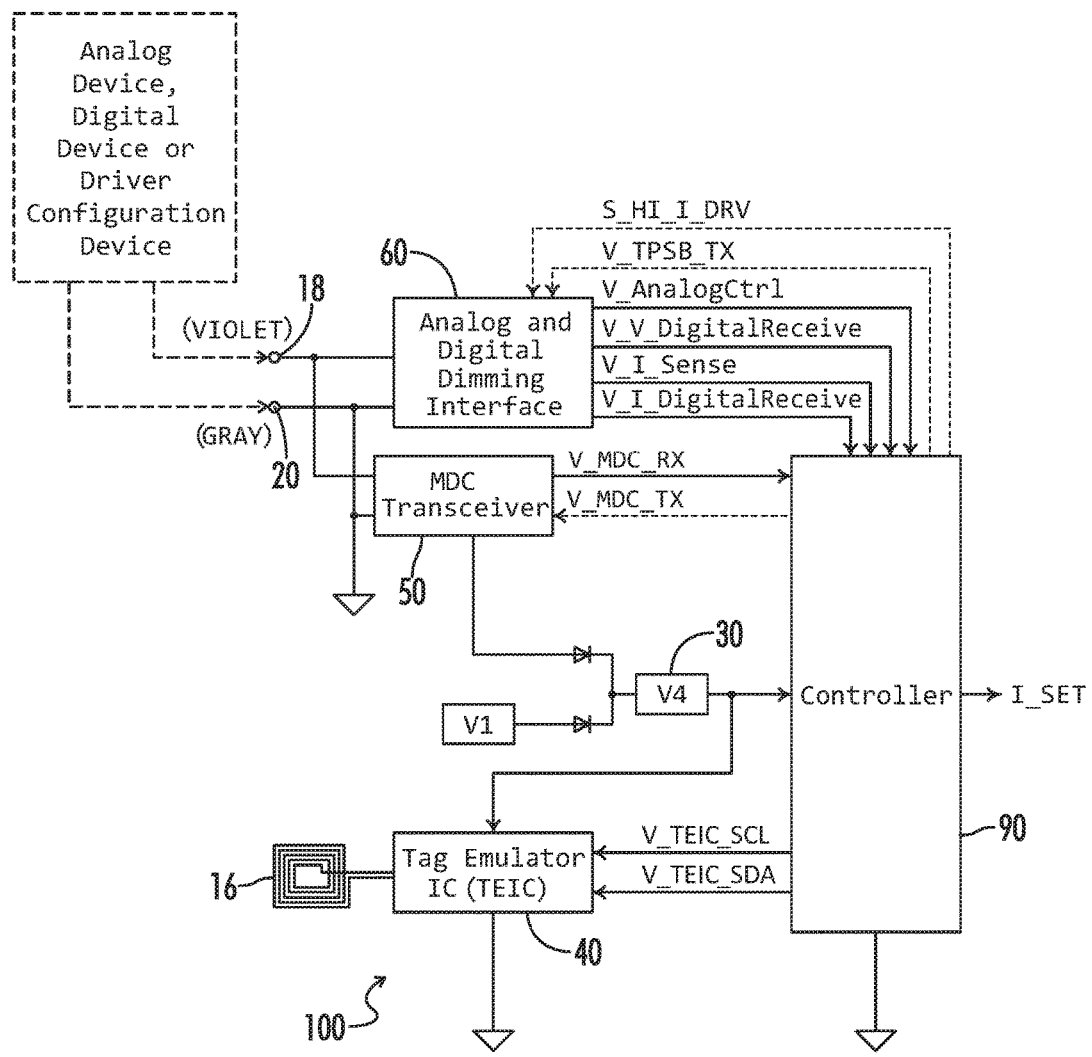
FIG. 2 is a block diagram representing an embodiment of interface and configuration circuitry in the lighting device of FIG. 1.

Referring next to FIG. 2, a power distribution circuit 30 receives the DC bus voltage V1 as derived from the AC mains input and generates a regulated DC voltage V4, e.g., 3.3 Vdc for internal distribution. The first and second input terminals 18 and 20 (e.g., violet wire and gray wire, respectively) are coupled to three different interfaces; a driver configuration circuit (e.g., MDC circuit interface) 50, an analog dimming interface, and a powered digital dimming interface (collectively illustrated as analog and digital dimming interface 60). Both the powered digital dimming interface 60 and the MDC circuit interface 50 can be used to configure the LED driver 10. An antenna 16 located outside the LED driver housing (not shown) is coupled to a wireless interface circuit 40 including a device U6 such as for example a dual-port, EEPROM, Tag Emulator IC (TEIC) to be used for configuration. The TEIC also features memory (e.g., SRAM) which can be used for boot-loading and real time data access for features such as power reporting or dimming.

In typical operation, upon a start-up condition a controller 90 for the interface and configuration circuit 100 retrieves from the TEIC circuit 40 any available configuration command, parses the command if available, and executes the configuration. The controller 90 also determines whether it is powered via DC power derived from the mains input (V1) or via the MDC transceiver circuitry by evaluating signal V_MDC_RX (pin 5 in FIG. 9). If the signal V_MDC_RX is high, an external configuration device must be connected to the first and second interface terminals 18, 20 in order to configure the driver via the MDC interface 50. If an external configuration device is connected to the driver, the controller 90 will first execute any commands stored in the wireless interface circuit 40, after which it will execute any configuration commands subsequently received from the external configuration device.

Under normal operating conditions with an external dimming device connected to the first and second input terminals 18, 20 the controller 90 constantly monitors and processes dimming data received from the external dimming device. After processing the dimming data, the microprocessor updates the reference point I_set applied to the LED driver controller.

Figure 4:
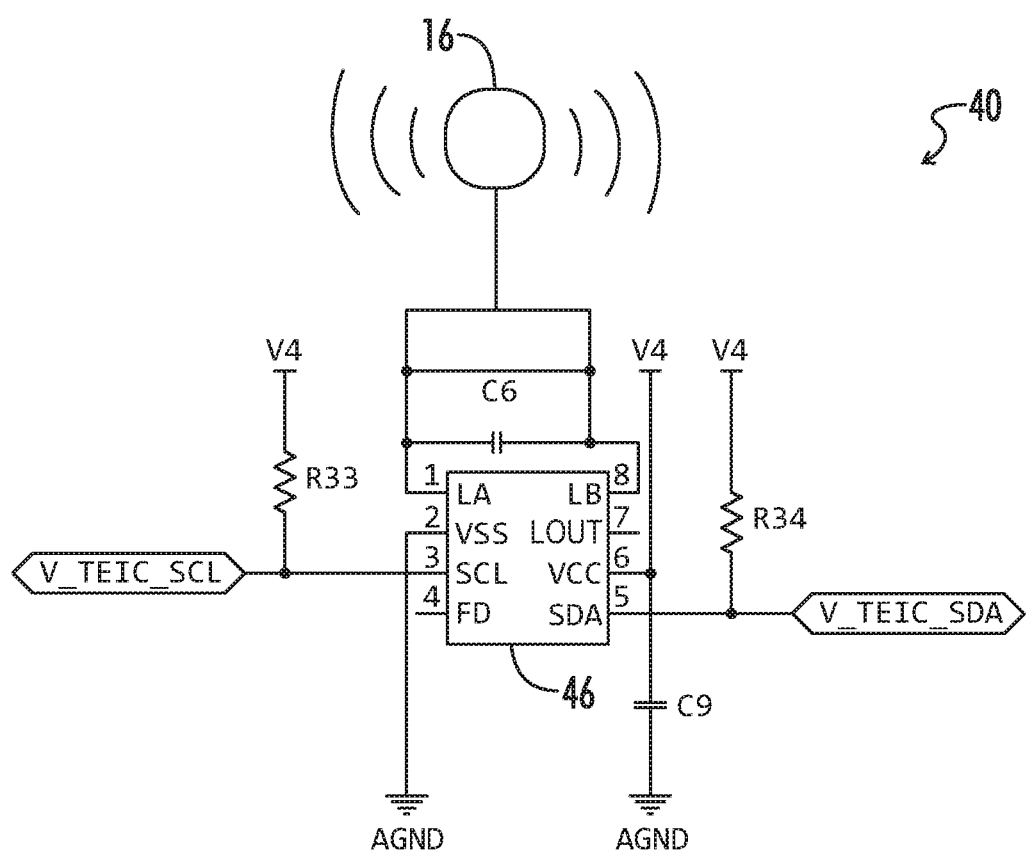
FIG. 4 is a circuit block diagram representing an exemplary embodiment of a TEIC circuit as disclosed herein.

An external configuration device, a particular type or description for which is not shown and further outside the scope of the present invention, can communicate with the wireless interface circuit 40, e.g., TEIC 40 via an RF field and the external antenna 16. Referring to FIG. 4, an embodiment of the wireless interface circuit 40 includes a dual-port EEPROM U6 having first and second antenna connections (pins 1 and 2) coupled to the antenna 16 across capacitor C6. The external configuration device will place a configuration command in a particular location in the dual-port EEPROM U6 of the TEIC 40. The external configuration device does not directly alter the existing configuration settings of the TEIC. The controller 90 in a typical embodiment does not retrieve and execute this command until power to the LED driver is cycled.

Figure 9:
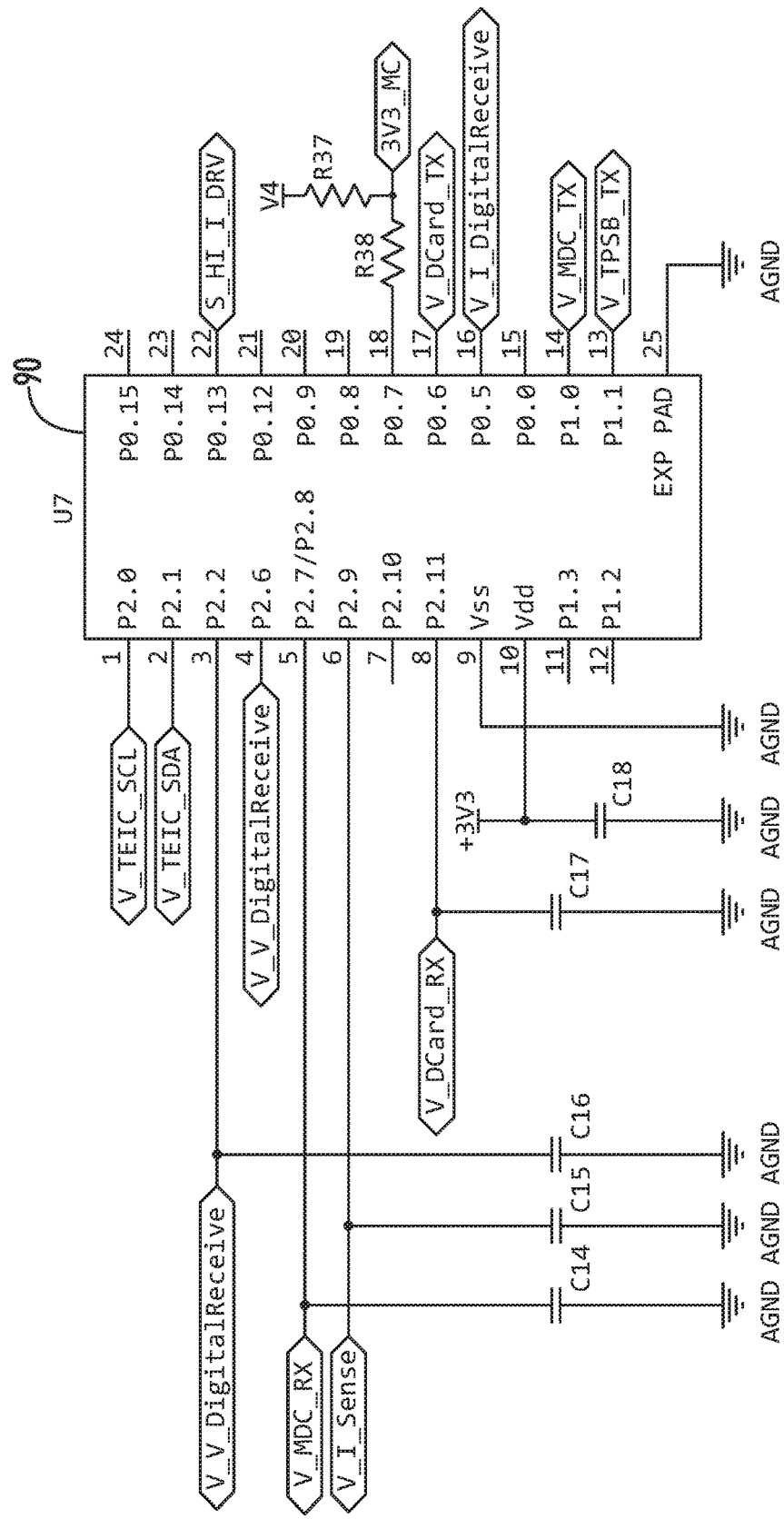
FIG. 9 is a circuit block diagram representing an exemplary embodiment of a controller for the interface and configuration circuitry as disclosed herein.

The controller 90 also communicates with the wireless interface circuit to acquire any available configuration commands, via connections V_TEIC_SCL, V_TEIC_SDA (U6 pins 3 and 5 in FIG. 4, U7 pins 1 and 2 in FIG. 9). Any configuration command stored in the wireless interface circuit is parsed and executed while waiting for commands from the MDC interface.

If an external configuration device is connected to the first and second input terminals 18, 20 without the application of mains input to the LED driver 10, the signal V_MDC_RX will go high, informing the controller 90 that an external configuration device has been attached. The controller 90 accordingly turns off signal V_TPSB_TX (U7 pin 14 in FIG. 9) and begins listening for commands from the external configuration device.

The external configuration device attached to the first and second interface terminals 18, 20 assigns a unique address to the lighting device 10, queries the lighting device 10 for its catalog number and serial number, and applies any configuration prescribed by the user of the external configuration device. This circuitry is designed to support this process for any number of LED drivers connected to the external configuration device, e.g., up to six drivers.

Figure 3:
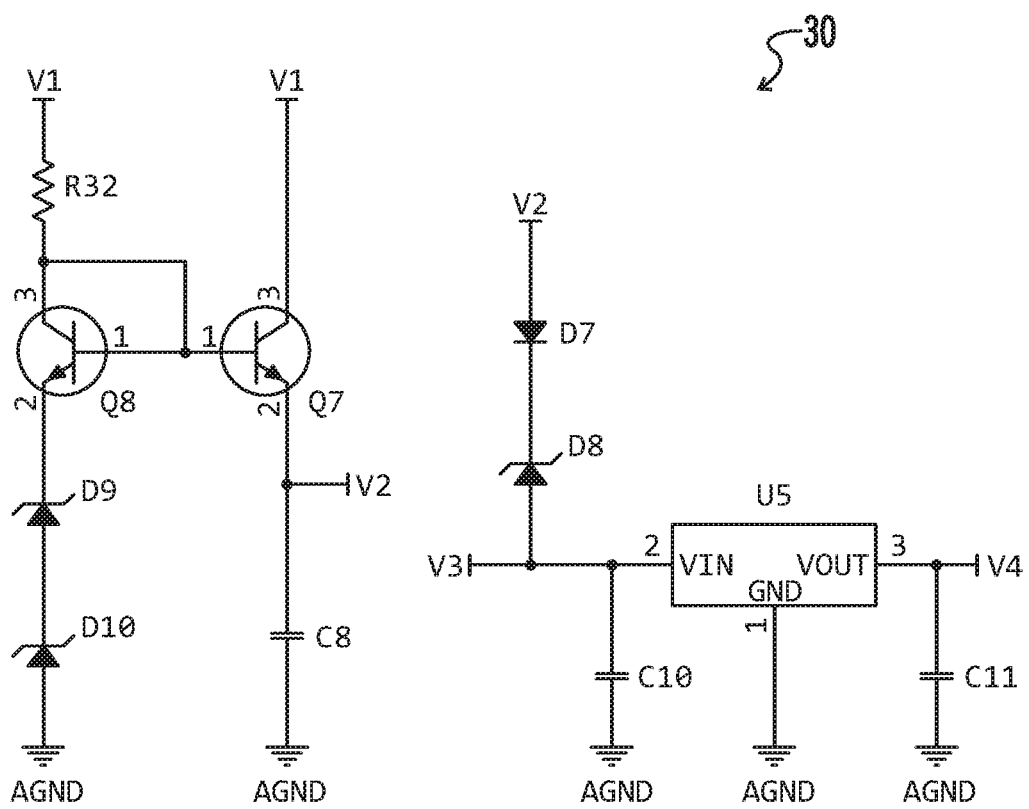
FIG. 3 is a circuit block diagram representing an exemplary embodiment of a power distribution circuit as disclosed herein.

Referring next to an embodiment of a power distribution circuit 30 as shown in FIG. 3, two series of regulators are provided to power the controller 90 via regulated internal DC voltage V4 when mains input power is applied to the lighting device 10. A first pass-transistor pre-regulator includes a bias resistor R32 coupled between the DC bus input V1 and switching element Q8, a control electrode for switching element Q8 being coupled to a control electrode for switching element Q7, and diodes D9 and D10 coupled between the switching element Q8 and circuit ground. The switching element Q8 provides temperature compensation for switching element Q7.

A linear regulator IC, U5, is coupled to the first regulator via a typical PN junction diode D7 and a Zener diode D8. In an embodiment, the reverse bias voltage of the Zener diode D8 may be chosen so that when an external configuration device is attached to the first and second interface terminals 18, 20 with mains input power applied, a voltage V3 is received via the external configuration device and pulled by the MDC transceiver circuitry above the output of the first pre-regulator minus the forward drop of the PN junction diode D7 and minus the reverse bias voltage of the Zener diode D8.

Figure 5:
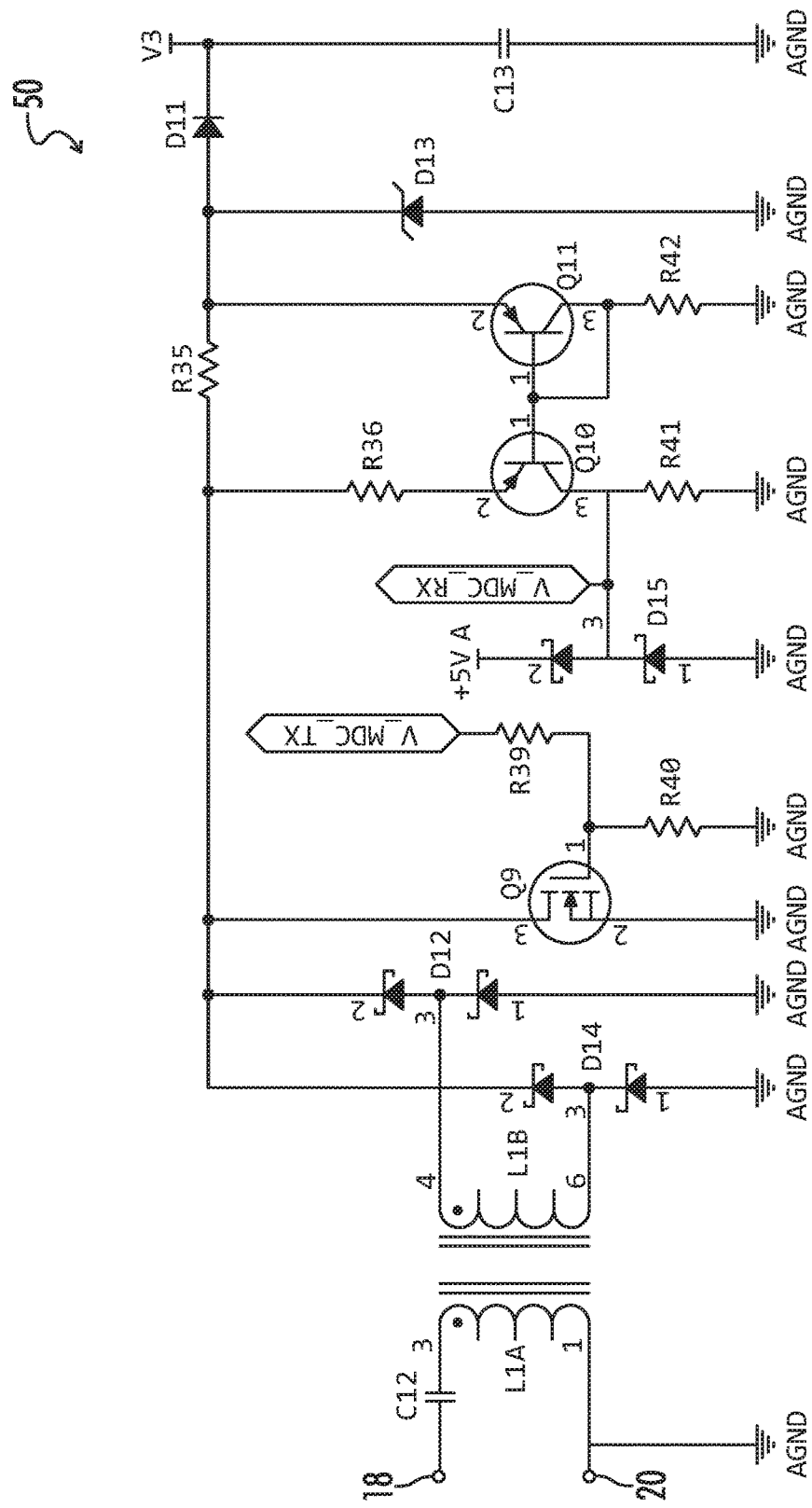
FIG. 5 is a circuit block diagram representing an exemplary embodiment of an MDC interface circuit as disclosed herein.

Referring now to an embodiment of a driver configuration circuit 50, e.g., a MDC transceiver circuit 50 as shown in FIG. 5, specification of the reverse bias voltage of the Zener diode D8 as noted above will guarantee that the external configuration device will power the controller 90, which will, in turn, allow the current measurement circuitry of the MDC transceiver to register a current. The current measurement circuitry as disclosed in FIG. 5 includes current sensing resistor R35 coupled in series with resistor R36 between respective emitter terminals for switching elements Q10 and Q11, resistor R41 coupled between the collector of switching element Q10 and circuit ground, and resistor R42 coupled between the collector of switching element Q11 and circuit ground.

An external configuration device can be coupled to the MDC transceiver circuit 50 via interface terminals 18, 20 via a DC blocking capacitor C12 and an isolation transformer L1. As the MDC transceiver circuit 50 shares the interface terminals 18, 20 with the analog and digital dimming control interface, it is desirable not to load the high impedance circuitry so as to skew measurement of the dimming control voltage, or inject noise into the analog dimming interface. Accordingly, under normal operating conditions where mains input is applied to the power stage of the LED driver and an external configuration device is not connected to the interface terminals 18, 20, the DC blocking capacitor C12 may block DC power from another interface circuit from flowing into the MDC transceiver circuit 50, and the MDC circuit 50 will not affect operation of the analog or digital dimming interface. The nature of an MDC signal is a substantially sinusoidal signal at relatively low output impedance. To the high frequency AC carrier signal, the DC blocking capacitor C12 will appear as a low impedance providing access to the isolation transformer T1. The secondary winding L1B of the transformer is coupled to a diode bridge D12, D14, a DC output from which is coupled across switching element Q9.

The registered current signal, V_MDC_RX, carries digital data from the external configuration device to the controller 90 (see U7 pin 5 in FIG. 9). In the event the current measurement circuitry develops more voltage V3 than what the linear regulator IC, U5, develops, Zener diode D15 is provided to protect input pin 5 to the controller 90. When a carrier signal is absent from the interface terminals 18, 20, the registered current signal V_MDC_RX is substantially zero, whereas when the carrier signal is applied to the interface terminals 18, 20 the registered current signal V_MDC_RX rises to an appropriate logic level value. The external configuration device responsible for developing the carrier signal modulates the carrier signal in an ON/OFF keying manner to send a serial stream of data from the external configuration device to the controller 90. The ON/OFF keying modulation of the carrier signal is detected by the registered current signal V_MDC_RX and applied to the controller 90 to be accumulated and interpreted as serial data to form queries and commands.

Replies from the controller 90 are returned to the external configuration device via V_MDC_TX (U7 pin 14 in FIG. 9) by controlling an ON/OFF state of switching element Q9 through resistor R39. Marks and spaces created by the turning ON/OFF of switching element Q9 are detectable by the external configuration device and accumulated into packets of data representing replies from the LED driver 10.

As the controller 90 is waking up during start-up of the LED driver 10, the GPIO pins default to a high input impedance, which can allow the switching element Q9 to turn on. To avoid inadvertently turning on the switching element Q9, a pull-down resistor R40 is also included.

The external configuration device is accordingly enabled to transfer configuration data to the lighting device 10. The term configuration data may be used herein to refer to parameters that are received and stored for programming operation of the lighting device (e.g., LED driver). Exemplary configuration data may include parameters (or values associated with said parameters) such as minimum and maximum output currents, dimming curve (e.g., linear, logarithmic), dimming control voltages, on/off states for enabling or disabling various programmable features such as lumen maintenance, a threshold voltage for triggering on/off functions, etc.

The term dimming control signals may typically as used herein refer to digital inputs corresponding to a lighting output such as a 0-100% dimming value, or an equivalent as allowable for the particular lighting device or load. Otherwise stated, the dimming control signals may specify a desired lighting output, whereas the device configuration data may specify internal operating parameters enabling the device controller to appropriately provide the desired lighting output.

Figure 6:
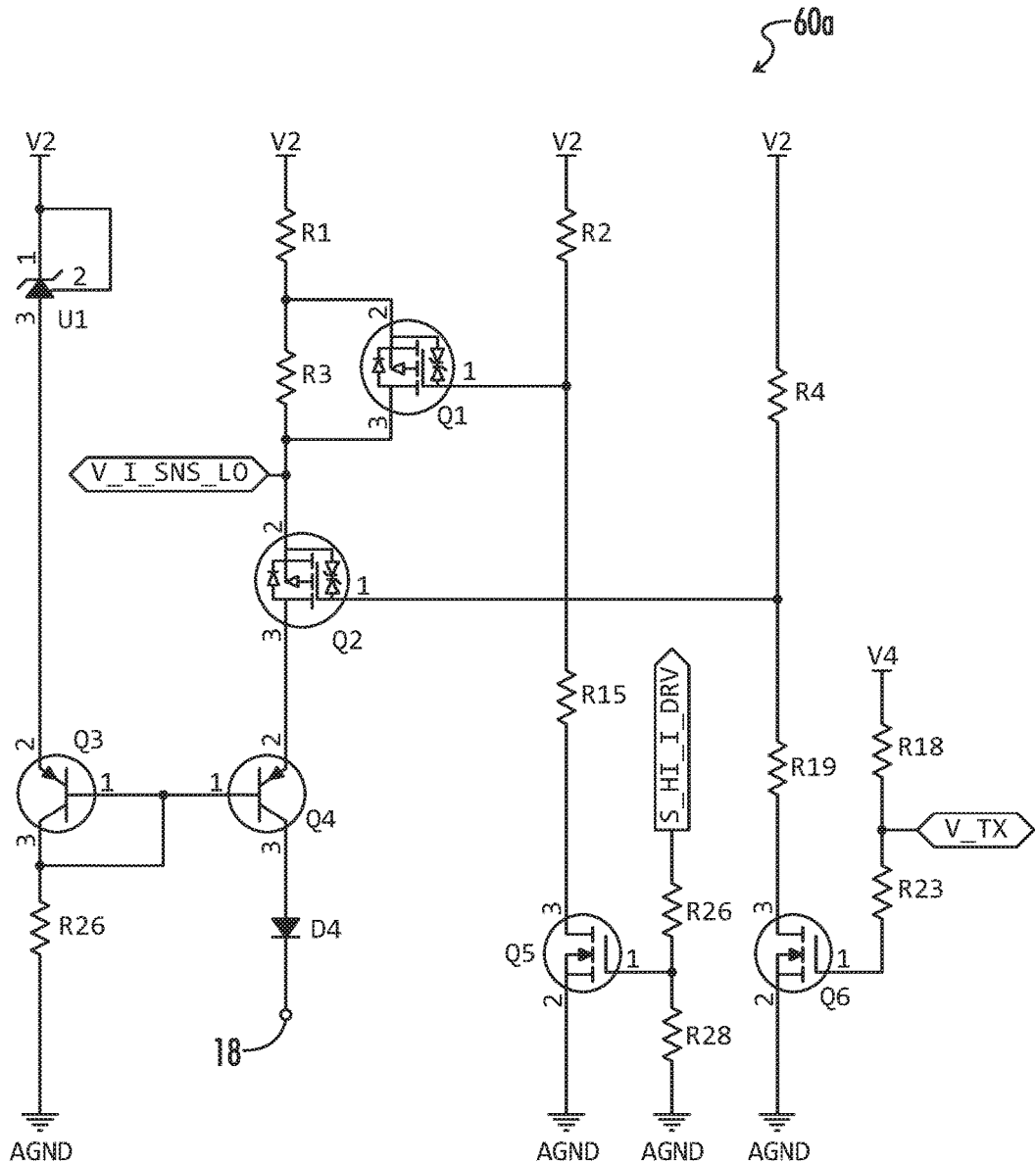
FIGS. 6-8 are circuit block diagrams representing an exemplary embodiment of analog and digital dimming circuitry as disclosed herein.
Figure 7:
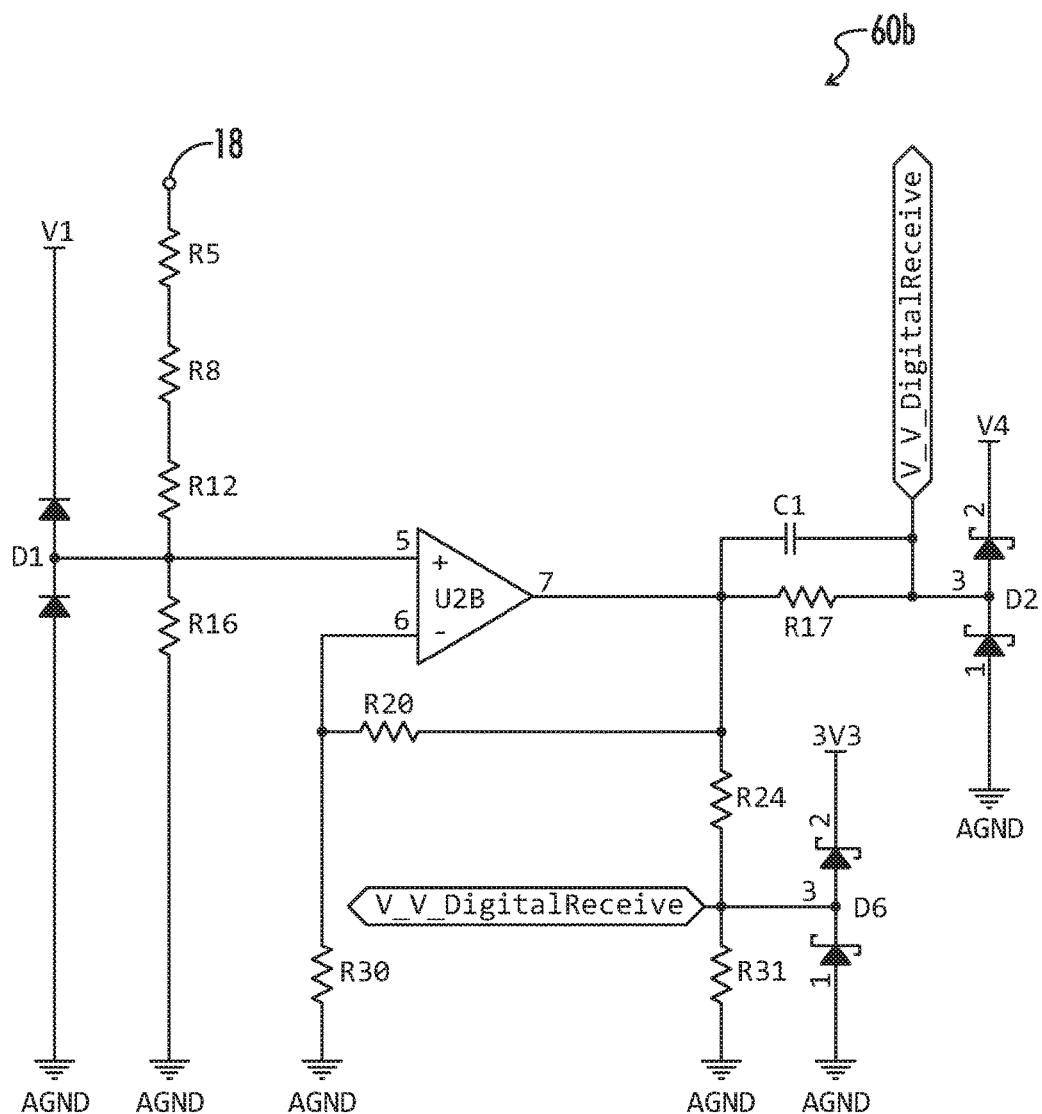
Figure 8:
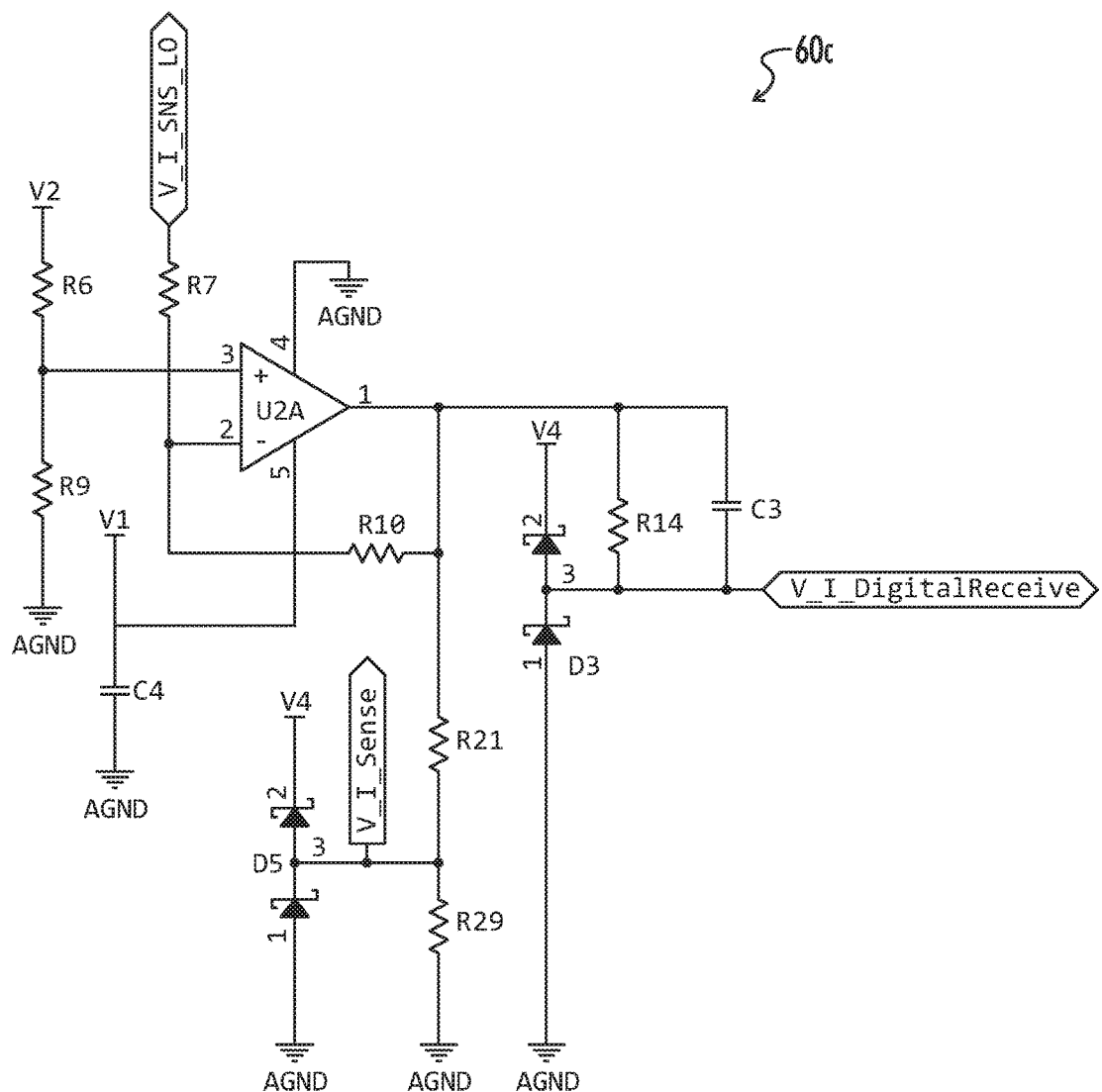

Referring to an embodiment of an analog and digital interface circuit as shown in FIGS. 6-8, a connected external dimming device will be powered by the current source created by components U1, Q3, R26, Q4, R1, and R3. Resistor R26 provides bias for a three-pin shunt regulator diode U1 and accepts current from the base of switching elements Q3 and Q4. Switching element Q3 provides temperature compensation for switching element Q4, which stabilizes the driven output current over a wide range of temperatures. To specify the quantity of the driven output current, a P-channel FET, Q1, is turned on by pulling down the gate voltage connected to the junction of resistors R2 and R15. Resistors R2 and R15 pull down the gate voltage of the P-channel FET Q1 when switching element Q5 is turned on by the controller 90 (U7 pin 22 in FIG. 9).

When the controller 90 is waking up from a reset, the GPIO pins default to a high impedance input, which would otherwise allow switching element Q5 to inadvertently turn on. To protect this circuitry against misapplication of mains input power to the interface terminals 18, 20, switching element Q5 and, in turn, switching element Q1 are placed in the default state of OFF by the application of a pull-down resistor R28. If switching element Q1 is off, the output current of the current source will be at its minimum, which will cause the least amount of heating of switching element Q4.

To gate the output current, switching element Q2 is turned on and off by pulling down the gate voltage at the junction of resistors R4 and R19, which is, in turn, controlled by turning on and off of switching element Q6 via controller 90

(U7 pin 13 in FIG. 9). To protect against misapplication of the mains input to the interface terminals 18, 20, switching element Q4 has to be turned on. Resistor R18 will guarantee that the default state of switching element Q6 is on, which will in turn guarantee that switching element Q2 is on.

Diode D1 will protect the input of operational amplifier U2B and diodes D2 and D6 will protect the inputs of the controller 90 (U7 pin 4 in FIG. 9). To measure the driven output current, amplifier U2A is wired in a differential amplifier configuration with the non-inverting input sourced by the output of the first pre-regulator of the power distribution circuit 30. The inverting input is sourced by the junction of switching element Q2 and resistor R3.

This current sensing configuration provides full range current measurement for both ranges of driven output current and, because the low output impedance nature of the first pre-regulator can deliver the current loaded by resistors R6 and R9 without a significant shift in voltage, the current measurement error associated with re-directing current around the measurement circuitry is minimized. At least these two design features increase the quality of the current measurement, which, in turn, increases the quality of the reported power consumption of the attached digital interface.

The response, i.e. slew rate, to a step change in voltage or current of operational amplifiers U2B and U2A, respectively, is slow and accordingly yields a poor quality digital pulse train. To improve the slew rate, differentiating capacitors C1 and C3 are connected between the outputs of the operational amplifiers U2B and U2A and the inputs of the controller 90.

During normal operation with an mains input applied to the LED driver, the analog and digital interface circuit 60 will supply power to and measure an analog dimming interface, and power and communicate with a digital dimming interface. In both scenarios, the power consumed by the dimming interface can be measured and reported.

All signals generated by the circuitry in FIGS. 3-8 are provided to the controller 90 as represented in FIG. 9, which processes the received the data and controls the LED driver 10 accordingly.

At power-up the controller 60 first checks the memory U6 of the wireless interface circuit 40 for a configuration command, after which it evaluates activity on the first and second interface terminals 18, 20. If signal V_MDC_RX is high, the controller 90 begins processing data from the MDC interface circuitry 50. In an embodiment, any configuration provided from an external configuration device via the MDC interface 50 supersedes the configuration that was stored in the wireless interface circuit 40 (e.g., TEIC).

If the signal V_MDC_RX is low, the controller 90 determines whether a digital or an analog dimming device is connected to the first and second interface terminals 18, 20. If a digital dimming device is connected the LED driver will change to a high output current state and communicate with the external device. Much like the configuration device is capable of sending configuration commands via the MDC interface circuitry 50, the digital dimming device is capable of sending configuration commands via the analog and digital interface circuitry 60. In an embodiment, the configuration commands sent via the analog and digital interface circuitry 60 will supersede the configuration that was stored in the wireless interface circuit 40 (e.g., TEIC).

Generally speaking, the circuitry 50, 60 internally connected to the first and second interface terminals 18, 20 will not support a simultaneous connection of a digital dimming interface and/or an analog dimming interface and/or a configuration device. The circuitry internally connected to the first and second interface terminals 18, 20 will only accept a singular connection of either a digital dimming device, a configuration device, or an analog dimming device.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices.

The term "circuit" means at least either a single component or a multiplicity of components, either active and/or passive, that are coupled together to provide a desired function.

The terms "switching element" and "switch" may be used interchangeably and may refer herein to at least: a variety of transistors as known in the art (including but not limited to FET, BJT, IGBT, IGFET, etc.), a switching diode, a silicon controlled rectifier (SCR), a diode for alternating current (DIAC), a triode for alternating current (TRIAC), a mechanical single pole/double pole switch (SPDT), or electrical, solid state or reed relays. Where either a field effect transistor (FET) or a bipolar junction transistor (BJT) may be employed as an embodiment of a transistor, the scope of the terms "gate," "drain," and "source" includes "base," "collector," and "emitter," respectively, and vice-versa.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

The terms "controller," "control circuit" and "control circuitry" as used herein may refer to, be embodied by or otherwise included within a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed and programmed to perform or cause the performance of the functions described herein. A general purpose processor can be a microprocessor, but in the alternative, the processor can be a microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A lighting device comprising:
   a driving circuit configured to convert AC mains input power into an output current for driving a lighting load;
   first and second terminals configured to receive corresponding terminals from any one of an analog dimming device, a digital dimming device or a driver configuration device;
   an analog and digital interface circuit coupled to the first and second terminals and configured to receive dimming control signals from the analog dimming device or the digital dimming device when coupled thereto;
   a driver configuration circuit coupled to the first and second terminals and configured to receive device configuration data from the driver configuration device when coupled thereto; and
   a controller configured to
      automatically detect whether one of the analog dimming device, the digital dimming device or the driver configuration device is coupled to the first and second terminals,
      enable a corresponding one of the analog and digital interface circuit or the driver configuration circuit, and
      generate output current reference signals for regulating the output current from the driving circuit, said reference signals corresponding to the received dimming control signals via the analog and digital interface circuit.

2. The lighting device of claim 1, further comprising a wireless interface circuit coupled to an antenna and linked thereby to a wireless communications network for transmitting and receiving configuration data, wherein the wireless interface circuit is configured to store the configuration data received during operation of the lighting device as new configuration data separate from the stored current configuration data.

3. The lighting device of claim 2, wherein the controller is configured upon a restart condition to retrieve the new configuration data from the wireless interface circuit and execute any associated configuration commands, and subsequently to obtain and execute any additional configuration commands determined from the device configuration data received from the driver configuration device via the driver configuration circuit.

4. The lighting device of claim 3, wherein the antenna is positioned external to a lighting device housing otherwise containing the wireless interface circuit, the controller, the analog and digital interface circuit, and the driver configuration circuit in an interior thereof.

5. The lighting device of claim 2, wherein the analog and digital interface circuit is further configured to power one of the analog dimming device or the digital dimming device coupled thereto.

6. The lighting device of claim 5, wherein the analog and digital interface circuit is further configured to measure power consumption data regarding the one of the analog dimming device or the digital dimming device coupled thereto.

7. The lighting device of claim 6, wherein the wireless interface circuit is further configured to store data corresponding to the measured power consumption data, and the stored power consumption data is retrievable remotely via the wireless communications network.

8. The lighting device of claim 1, wherein the analog and digital interface circuit is further configured to receive the device configuration data from the driver configuration device when coupled thereto.

9. The lighting device of claim 1, further comprising:
   a first regulator circuit coupled to a DC bus voltage derived from the AC mains input power and configured to produce an intermediate DC voltage; and
   a second regulator circuit coupled to receive the intermediate DC voltage and to the driver configuration circuit,
   wherein the second regulator circuit is configured to produce a supply voltage to the controller via the driver configuration circuit when the driver configuration device is coupled to the first and second terminals, and to otherwise produce the supply voltage to the controller via the first regulator circuit.

10. The lighting device of claim 9, wherein the driver configuration circuit comprises at least first and second communications nodes linked to the controller, and controller protection circuitry coupled to each of the at least first and second communications output nodes.

11. The lighting device of claim 10, wherein the analog and digital interface circuit is coupled to receive the intermediate DC voltage from the first regulator, and comprising at least one switching element,
    wherein a current output to the analog dimming device or the digital dimming device is provided via the first and second terminals and regulated by switching the at least one switching element on and off according to drive signals from the controller.

12. The lighting device of claim 11, wherein the controller protection circuitry of the driver configuration circuit comprises first controller protection circuitry, and the analog and digital interface circuit comprises second controller protection circuitry further coupled between the at least one switching element and the drive signal inputs from the controller.

13. The lighting device of claim 12, wherein the analog and digital interface circuit comprises at least first and second digital communications nodes linked to the controller, and the second controller protection circuitry coupled to each of the at least first and second communications output nodes.

14. The lighting device of claim 1, wherein the driving circuit further comprises one or more switching elements configured to produce the output current for driving the lighting load based on a switching frequency, and a driving circuit controller configured to generate gate drive signals to regulate the switching frequency of the switching elements based on the current reference signals.

15. A lighting device comprising:
    a power stage configured to convert AC mains input power into a DC bus voltage, and further to convert the DC bus voltage into an output current for driving a lighting load;
    first and second terminals configured to receive corresponding terminals from any one of an analog dimming device, a digital dimming device or a driver configuration device;

a power distribution circuit configured to generate a regulated DC voltage based on the DC bus voltage;

an analog and digital interface circuit coupled to the first and second terminals and to receive the regulated DC voltage from the power distribution circuit, and configured to provide power to and receive dimming control signals from the analog dimming device or the digital dimming device when coupled thereto;

a driver configuration circuit coupled to the first and second terminals and configured to receive input power and device configuration data from the driver configuration device when coupled thereto; and a controller configured when a driver configuration device is coupled to the first and second terminals, to receive power and device configuration data applied via the driver configuration device, and when an analog dimming device or a digital dimming device is coupled to the first and second terminals and mains input power is applied to the power stage, to receive power applied via the power distribution circuit and to generate output current reference signals for regulating the output current from the power stage, said reference signals corresponding to the received dimming control signals via the analog and digital interface circuit.

16. The lighting device of claim 15, further comprising a wireless interface circuit coupled to an antenna and linked thereby to a wireless communications network for transmitting and receiving configuration data, wherein the wireless interface circuit is configured to store the configuration data received during operation of the lighting device as new configuration data separate from the stored current configuration data.

17. The lighting device of claim 16, wherein the controller is configured upon a restart condition to retrieve the new configuration data from the wireless interface circuit and execute any associated configuration commands, and subsequently to obtain and execute any additional configuration commands determined from the device configuration data received from the driver configuration device via the driver configuration interface circuit.

18. The lighting device of claim 17, wherein the analog and digital interface circuit is further configured to measure power consumption data regarding the one of the analog dimming device or the digital dimming device coupled thereto.

19. The lighting device of claim 18, wherein the wireless interface circuit is further configured to store data corresponding to the measured power consumption data, and the stored power consumption data is retrievable remotely via the wireless communications network.

20. A lighting device comprising:

a power stage configured to receive AC mains input power and to produce output power for driving a lighting load; and an interface and dimming control stage comprising first and second terminals configured to receive corresponding terminals from any one of an analog dimming device, a digital dimming device or a driver configuration device;

means for receiving and applying device configuration data received from the driver configuration device when coupled to the first and second terminals, in the absence or presence of AC mains input power applied to the power stage; and means for providing power to, and receiving dimming control signals from, the analog dimming device or the digital dimming device when coupled to the first and second terminals.

* * * * *